United States Patent [19]

Barnacle

[11] 4,187,751
[45] Feb. 12, 1980

[54] LEAD CROPPING APPARATUS

[75] Inventor: Leslie J. H. Barnacle, Coventry, England

[73] Assignee: Cosarnia Limited, St. Peter Port, Channel Islands

[21] Appl. No.: 913,579

[22] Filed: Jun. 6, 1978

[30] Foreign Application Priority Data

Jun. 14, 1977 [GB] United Kingdom ............ 24667/77
Mar. 11, 1978 [GB] United Kingdom ............ 9723/78

[51] Int. Cl.$^2$ .................... B23C 1/08; B26D 7/06
[52] U.S. Cl. ........................... 83/458; 83/465; 83/580; 83/925 R; 269/266; 269/275; 29/566.3
[58] Field of Search ............ 83/580, 465, 926 B, 83/694, 925 R, 458; 81/9.51; 29/566.3; 269/266, 275

[56] References Cited
U.S. PATENT DOCUMENTS

| 2,230,802 | 2/1941 | Klein | 83/458 |
|---|---|---|---|
| 2,754,708 | 7/1956 | Peterson | 269/266 |
| 3,307,442 | 3/1967 | Imoff | 83/925 |
| 3,395,439 | 8/1968 | Palesi et al. | 269/275 |
| 3,453,918 | 7/1969 | Sharp | 83/925 |
| 3,798,734 | 3/1974 | Fedor | 29/566.3 |
| 3,799,017 | 3/1974 | Halligan | 83/580 |
| 4,072,077 | 2/1978 | Morgan | 83/435.1 |

Primary Examiner—Donald R. Schran
Attorney, Agent, or Firm—Schwartz & Weinrieb

[57] ABSTRACT

Apparatus for cropping the connecting leads of electrical components assembled on a circuit board having locating holes therein through which the leads have been inserted, which apparatus comprises a plate provided with holes at spacings corresponding to the holes in the circuit board against which the circuit board is placed, the leads of the electrical components extending through the aligned holes in the circuit board and plate; a first structure adapted to support the plate and having a cutter means movable to crop the portions of the leads of the components extending through the holes in the plate; and a second structure carrying a multiplicity of substantially parallel individually axially displaceable rods which are movable into engagement with components on a circuit board placed on said plate to hold the components in position on the circuit board, said first and second structures being movable relative to one another whereby movement of one of the structures towards or away from the other is effective to move the rods into or out of engagement with the components on the circuit board.

28 Claims, 14 Drawing Figures

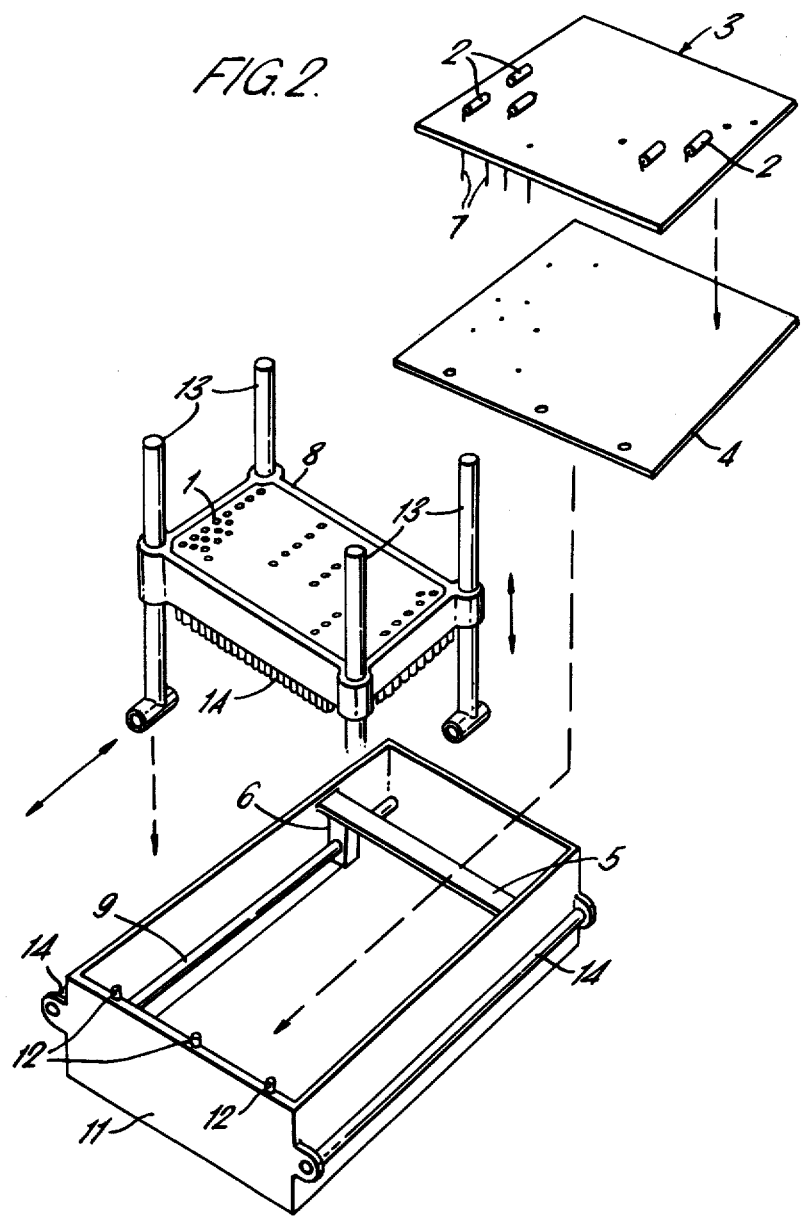

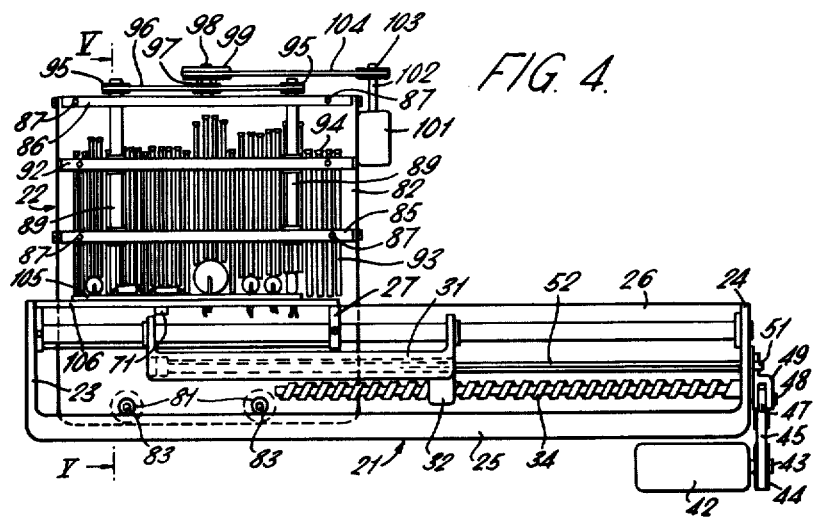
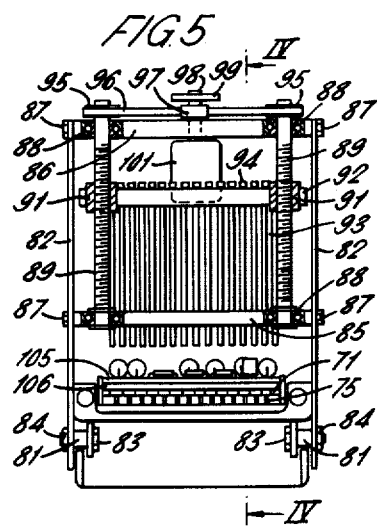 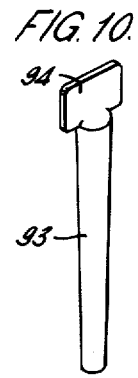

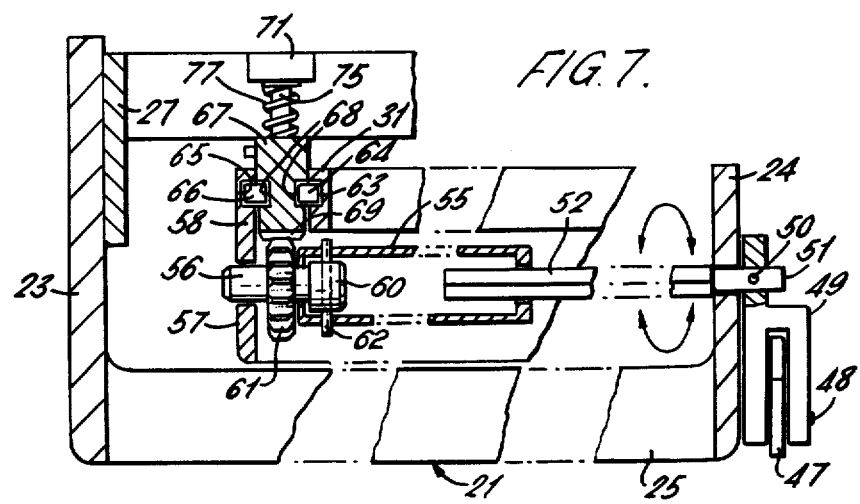
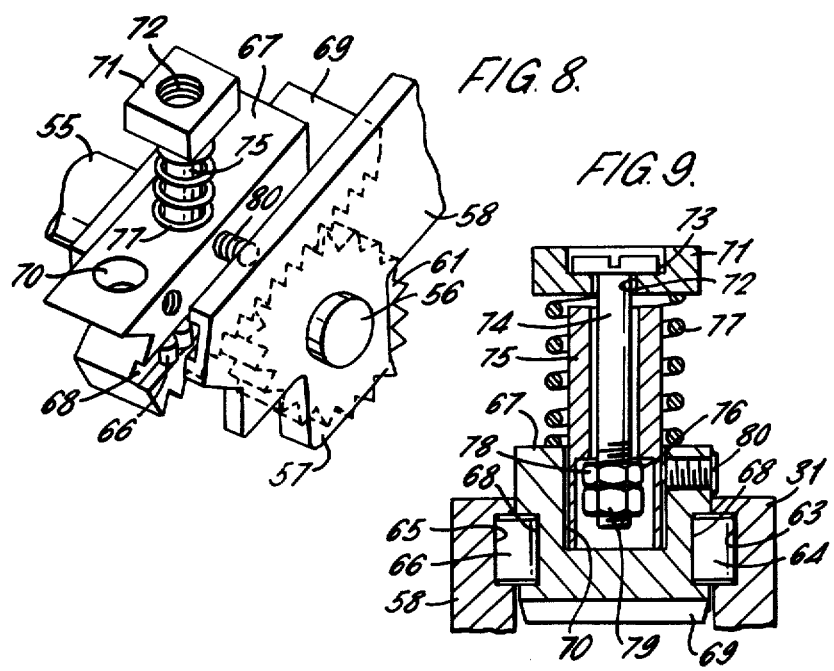

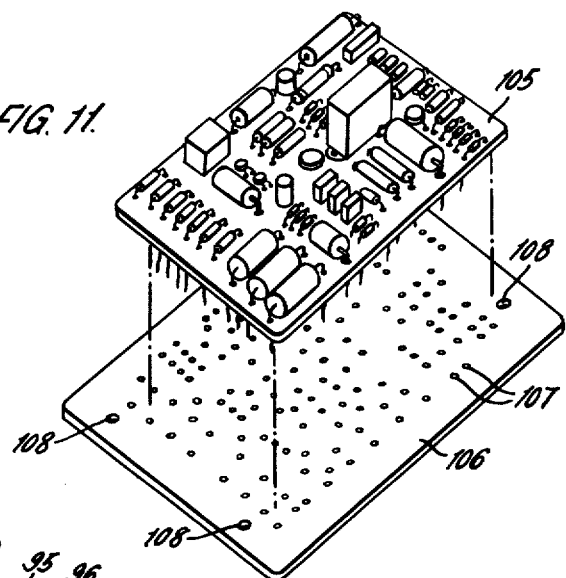
FIG. 11.
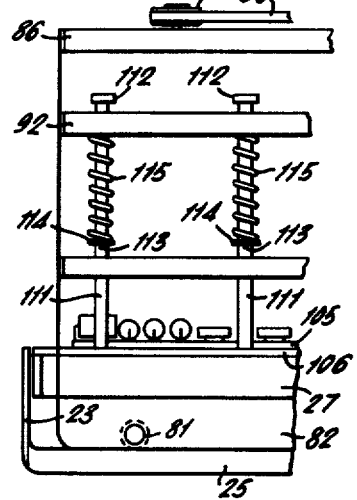
FIG. 12.
FIG. 13.
FIG. 14.

4,187,751

LEAD CROPPING APPARATUS

BACKGROUND OF THE INVENTION

This invention relates to apparatus by which connecting leads of electrical components (for example, resistors, capacitors, transistors and diodes) to be secured to a circuit board having component locating holes therein (for example, a printed circuit board) are cropped to a length required for soldering to conductive portions of the board after the leads have been inserted through appropriate locating holes in the board.

It is desirable that whatever the shape and size of a component, the length of the connecting leads extending from the underneath face of the board, after the cropping operation has been performed, shall be uniform, as this enables soldered joints of uniform size to be effected more rapidly on the underneath face of the board between each cropped lead and the adjacent conductive portion of the board and avoids the need to crop any portions of the leads after soldering as the length of the cropped leads will be just sufficient to form effective soldered joints.

Before reciting and describing how the invention aims to achieve this, it is convenient to review the existing methods used for cropping the excess lengths of leads of components to be fitted to a printed or other circuit board having locating holes therein through which the leads are to be inserted.

One known method is to preform and cut the leads to length before inserting them through the holes in the circuit board. This is not an economical or technically desirable method and furthermore the minimum length of lead required for easy and rapid assembly is greater than that required to project from the underneath face of the board for forming a soldered joint and thus after soldering, further cropping of the leads may be required.

Another known method is to cut the leads by a hand tool after the components have been located on the board by inserting the leads through the locating holes but before soldering. This is a laborious and uneconomical method and moreover as the board would have to be turned over to enable the projecting leads to be cropped it is difficult to stop the components from falling from the board when that operation is being carried out. It has been proposed to hold the components on the board by means of a resilient cushion (U.S. Pat. No. 3,395,439) while the leads are being cut but, even so, it is difficult to cut the leads to a uniform projecting length and so further cropping after soldering is frequently required.

Yet another known method is to place the board and assembled components over a plate which has been pre-drilled with holes corresponding to the holes in the board so that the leads extending from the board will pass through the holes in the plate and then to pass a cutting blade across the underneath face of the plate to crop all the leads at a single stroke to a uniform length equal to the thickness of the plate. This method has the advantage of accurate and rapid cropping of the leads but suffers from the disadvantage that it is difficult to hold the components in position during the cropping operation as the components are usually of different shapes and sizes.

SUMMARY OF THE INVENTION

It is an object of the invention to provide apparatus for cropping the leads of components to a required uniform length after the leads of the components have been inserted through locating holes of a circuit board, which apparatus is suitable for use with boards of different types, sizes and thicknesses and also for use with components of different types, shapes and sizes.

According to the invention, there is provided apparatus for cropping the connecting leads of electrical components assembled on a circuit board having locating holes therein through which the leads have been inserted, said apparatus comprising a plate provided with holes at spacings corresponding to the holes in the circuit board which are to be used to locate the components, said plate having a first surface against which, in use, is placed the circuit board on which electrical components have been arranged by passing the leads thereof through appropriate holes in the circuit board, the leads extending through the holes in the circuit board and also through corresponding holes in the plate; a first structure adapted to support the plate and on which is mounted a cutter means movable in proximity to a second surface of the plate substantially parallel with said first surface to crop the portions of the leads of the components extending through the holes in the plate beyond said second surface by a shearing or cutting action; and a second structure carrying a multiplicity of substantially parallel rods which are movable into engagement with components on a circuit board placed on said plate which is supported on the first structure, the ends of the rods engaging said components to hold the components in position on the circuit board and said rods being individually axially displaceable whereby the rods are displaced relatively one to another according to the size or shape of the different components, said first and second structures being movable relative to one another whereby movement of one of said structures toward or away from the other is effective to move the rods into engagement with the components on the circuit board or to release the rods from the components.

Preferably, the first structure is adapted to support the plate in a substantially horizontal plane with the said first surface of the plate uppermost and the second structure is capable of being positioned with the rods located above a circuit board placed on the plate, said rods being upwardly displaceable by engagement of components on the circuit board with the lower ends of the rods against the downwardly-acting weight of the rods to clamp the components on the circuit board when relative movement of the first and second structures towards one another is effected.

Conveniently, the rods are positioned adjacent each other in a grid pattern extending over the whole or at least a major portion of the plate, whereby at least one rod will be upwardly displaced by a component to clamp the latter on the circuit board, thereby to enable any desired arrangement of components of different types, shapes or sizes to be clamped on the circuit board, as aforesaid. Each rod is desirably provided with an enlarged head portion to prevent it from falling out of the second structure.

The circuit board may be of any size or shape which can be located on the plate. Several circuit boards with components thereon may be arranged side-by-side on the plate.

The rods may be of any cross-sectional shape and may have side faces each shaped to conform to and slide relatively past an adjacent face of an adjacent rod. For example, adjacent side faces of each of the rods may be alternately concave and convex, whereby a convex side face of a rod will slidably co-operate with a concave side face of an adjacent rod. Alternatively, the rods may be of square cross-section and may be arranged in a grid formation in which the rods are slidable relatively to each other in columns and rows extending parallel to the edges of the plate, where the latter is rectangular. In yet another arrangement, the columns and rows of square cross-section rods may be inclined to the edges of a rectangular plate, whereby the rods, in plan, are arranged in a diamond formation over the plane of the plate.

The second structure may be vibratable, thereby to ensure that the rods settle on the components mounted on the circuit board.

The lower end faces of the rods may be resiliently deformable, thereby to tend to conform, when clamping a component, to the shape of an upper part of the surface of the component. The lower end faces of the rods may carry resiliently deformable end pads for this purpose.

The rods may be carried on pins of smaller cross-sectional dimensions depending from said second structure, the rods and pins being displaceable upwardly when the lower ends of the rods are engaged with components on a circuit board.

In the foregoing arrangements in which the rods depend from said second structure under their own weight, the clamping effect of the rods on the components may be augmented by additionally applied loading on the rods, for example by spring means or pneumatic or hydraulic means acting on the rods. Furthermore by using loading means, such as spring means, or pneumatic or hydraulic means acting to effect clamping of the rods on the components, it is possible for the plate and circuit board to be arranged upright, in use, instead of horizontal.

An advantage of arranging the plate and circuit board horizontally is that the components are subjected only to clamping loads due to the weights of the rods and therefore the risk of damaging the components while they are being clamped is reduced.

The second structure preferably includes a plate having a plurality of bores therein, the rods being axially displaceably mounted in said bores. This plate is desirably movable with respect to the remainder of the second structure and may be arranged to be driven by an electric motor towards and away from the first structure.

The second structure is preferably movably mounted on the first structure and may be provided with rollers engaged with rails forming part of the first structure so that the second structure is movable in a horizontal direction with respect to the first structure. Means are preferably provided to prevent horizontal movement of the second structure with respect to the first structure when the rods are in a position to clamp components on a circuit board supported on the board supporting plate. Said means may comprise a number of upstanding pegs provided on the first structure which are engageable by a corresponding number of tubular members carried by the second structure when the rods are moved towards a circuit board supported on the board supporting plate to clamp components on said circuit board.

The cutter means is preferably mounted on a carriage which is movably mounted in the first structure and which may be arranged to be driven by an electric motor. The cutter means may also be mounted for oscillating movement with respect to the carriage.

According to one embodiment of the invention, the cutter means comprises a single blade. However, in some instances a lead is so bent by the blade as to lie flat against the underneath surface of the plate instead of being cropped. The bent lead therefore deflects the blade away from the underneath surface of the plate and then the remainder of the leads in the path of the blade are bent by the blade instead of those leads being cropped.

Therefore, according to a preferred embodiment of the invention, instead of providing a single knife-like blade extending across the width of the plate, a plurality of blades are mounted on a common blade carrier movable with respect to said first structure supporting the plate and are preferably individually resiliently urged in use into engagement with said second surface of the plate.

By mounting the blades so that they are individually resiliently urged into engagement with said second surface of the plate, if any lead should be bent into engagement with said second surface of the plate instead of being cropped, the other blades will still be correctly positioned to effect cropping of other leads and also the temporarily deflected blade will be urged into engagement with said second surface of the plate as soon as that blade has moved past the bent lead. Thus, the occurrence of bent leads is minimised.

In one form of the apparatus according to the present invention, the individually supported blades may each be arranged to be turned about a vertical axis. Thus whatever is the angular position of the blade about its axis, a lead engaged by the blade will be cropped.

The blades may be of any shape, as viewed in plan, thereby to provide a continuous cropping edge or a plurality of cropping edges spaced from the axis of rotation. For example, the blades may take the form of discs of circular, triangular, square or other polygonal shape.

The blades, where rotatably mounted, may be freely rotatable by their engagement with a lead or the blades may be rotatably driven by a powered driving means in the apparatus.

The blade carrier may extend from one end of the first structure to the other with respect to the plate. Where the blades are individually rotatable or are provided with leading and trailing cropping edges, they will be able to crop leads on feeding of the blade carrier in either direction, that is in its forward and return strokes.

According to another preferred embodiment of the invention, a plurality of blades are provided and each blade is mounted on the carrier by means of a pair of pins, a spring being provided on each pin to urge the blade in a direction away from the carrier.

The blades may be mounted in two or more rows each containing a plurality of blades and spaced apart in the direction of the feeding movement. The blades in one row may be staggered in the transverse direction of the first structure with respect to the blades of the or another row. In this way the blades may be arranged to cut across the whole width of the blade as does a single knife-like blade.

The invention may also provide, as a clamping jig, said second structure and the rods carried thereon, the clamping jig being attachable to or usuable with an existing lead-cropping machine comprising a plate for supporting a circuit board and a lead-cropping blade movable past the face of the plate remote from that supporting the circuit board.

Whether the invention provides a complete apparatus for cropping leads of components mounted on a circuit board or a clamping jig, the plate may have pre-drilled holes in a grid pattern, whereby different types, shapes or sizes of circuit board may be accommodated, provided the holes being used for components mounted on the circuit board can be aligned with holes in the plate. Alternatively, the circuit board may be used as a template to enable holes to be made at required spacings in the plate.

BRIEF DESCRIPTION OF THE DRAWINGS

The invention will now be further described, by way of example, with reference to the accompanying drawings, in which:

FIG. 2 is an exploded perspective view of the apparatus shown in FIG. 1;

FIG. 4 is a section taken on the line IV—IV in FIG. 5 in the direction of the arrows and shows a second embodiment of an apparatus according to the invention with the clamping rods in the lowered position;

FIG. 5 is a section taken on the line V—V in FIG. 4 in the direction of the arrows but showing the clamping rods in the raised position;

FIG. 7 is a section taken on the line VII—VII in FIG. 6 in the direction of the arrows;

FIG. 8 is a perspective view of part of the cutter means shown in FIG. 7 to an enlarged scale;

FIG. 9 is a section through one embodiment of a cutter according to the invention;

FIG. 10 is a perspective view of one embodiment of a rod or pin used in the apparatus shown in FIGS. 4 and 5;

FIG. 11 is a perspective view of a circuit board and a plate adapted to receive a circuit board;

FIG. 12 shows details of the apparatus which are not visible in FIGS. 4 and 5;

FIG. 13 is a perspective view, corresponding to FIG. 8 of a modified form of cutter means; and FIG. 14 is a perspective view of yet another modified form of cutter means.

In the drawings, like parts are denoted by like reference numerals.

DESCRIPTION OF PREFERRED EMBODIMENTS

Figure 1:
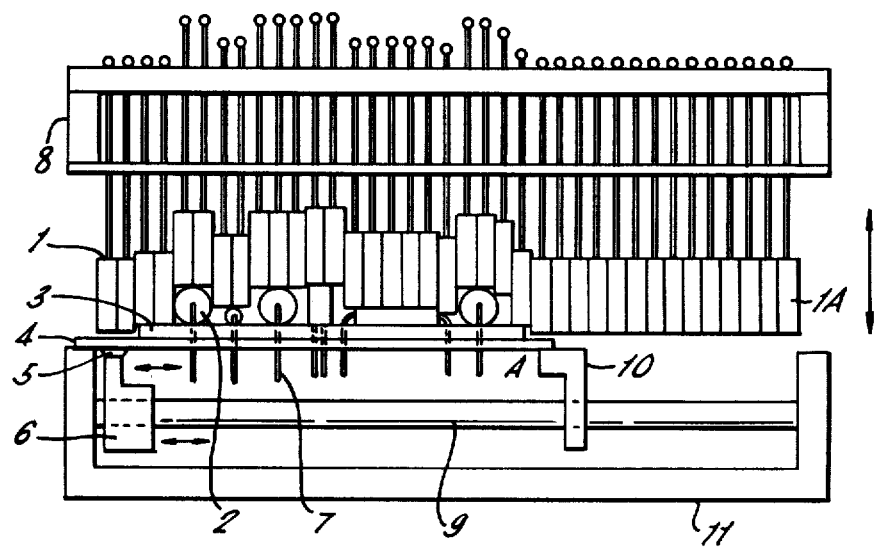
FIG. 1 is a diagrammatic side view of one embodiment of an apparatus according to the invention.

Reference will first be made to FIGS. 1 and 2 of the drawings in which the apparatus comprises a first structure in the form of a rectangular frame 11 which supports on its upper edge a plate 4. The plate 4 is located on pegs 12 which project upwardly from the frame 11 and ensure that the plate 4 is correctly positioned. The frame 11 supports a blade 5 which is slidable past the lower face of the plate 4. The blade 5 is mounted on a carrier 6 which is movable along slide rails 9 from the position illustrated in FIG. 1 to the position A at which it will reach a stop 10. The blade 5 and its carrier 6 may be moved by a manual mechanism or by power means, such as a pneumatic or hydraulic ram. The upper face of the plate 4 supports one or more circuit boards 3 on which various electrical components such as resistors, capacitors, transistors and diodes have been mounted. Such components have connecting leads, usually long stiff wires extending from the components. The circuit boards, for example, printed circuit boards, have holes therein through which the connecting leads are inserted after the leads have been appropriately bent. The plate 4 is either a pre-drilled plate having a special or universal arrangement of holes therein or it is drilled or otherwise formed with holes corresponding to those on the circuit board by using the circuit board 3 as a template. The circuit board 3 is placed on the plate 4 with the holes in the circuit board vertically aligned with holes in the plate 4. Then the components 2 are mounted on the circuit board so that the leads 7 of the components 2 extend through the appropriate holes in the circuit board 3 and through corresponding holes in the plate 4, as shown in FIG. 1. The assembly of the components on the circuit board 3 and the plate 4 may be performed either away from the apparatus or after the plate 4 has been located on the frame 11. When the assembly of the components has been completed the plate 4 is carefully located on the frame 11 where the assembly is not performed with the plate 4 already in position on the frame 11. Then by moving the carrier 6 and blade 5 from the illustrated position to the position A, shown in FIG. 1, the leads 7 will be cropped to the level of the lower surface of the plate 4, that is the lengths of all the leads 7 extending from the lower face of the circuit board 3 will be the same and equal to the thickness of the plate 4.

To hold the components 2 in position while the cropping operation is performed, the apparatus also includes a clamping jig. This consists of a second structure in the form of a frame 8 which is vertically movable on four upright pillars 13 (shown in FIG. 2). The structure comprising the four pillars 13 and the frame 8 is slidable longitudinally of the frame 11 along guide rails 14 (see FIG. 2) on the latter. The frame 8 carries a multiplicity of rods 1A of square cross-section (see particularly FIG. 3) arranged in a grid formation extending over the whole area within the frame 8 and slidable with respect to one another. The rods 1A are each suspended on pins 1 supported by the frame 8. The frame 8 containing the rods 1A and pins 1 can be slid along the guide rails 14 to a position above the plate 4 and circuit board 3 placed thereon. Then by moving the frame 8 downwardly on the pillars 13 to bring the rods 1A to the position shown in FIG. 1 in which those rods outside the perimeter of the circuit board 3 hang freely with their lower ends just below the level of the upper surface of the circuit board, the rods 1A within the periphery of the circuit board 3 will be raised by the board or a component 2 on the board, as shown in FIG. 1. The amount of lifting of the rods 1A will depend upon the shape and size of each component. The components 2 will thus be clamped by the weight of the combined rods 1A and pins 1. The frame 8 may be vibrated to ensure that the rods 1A fall to the extent permitted at each position in the grid and determined by the presence or not of a component at that position.

The sequence of operations in assembling a circuit board is as follows:

The components 2 are assembled on the circuit board 3, which has been arranged with its holes in vertical registration with holes in the plate 4, either with the plate 4 in situ on the frame 11 or externally of the apparatus provided by this invention, the leads 7 being passed through appropriate holes in the board 3 and plate 4. The board 3 and plate 4 together with the loose components are then, if assembled externally of the apparatus, carefully transferred to the apparatus. The frame 8 is first moved away from its position immediately above the plate 4. Then the frame 8 is moved to a position above the plate 4 and is lowered (or the frame 11 is raised) to the position shown in FIG. 1, in which the rods 1A will rest on, and hence clamp, the components 2 on the circuit board 3. Then the blade 5 is moved with its carrier 6 along the slide rail 9 to crop all the leads 7 by a shearing or cutting action at the level of the lower surface of the plate 4. The frame 8 is then raised (or the frame 11 is lowered) to separate the rods 1A from the components 2 and thus to unclamp them. The frame 8 is then moved away from its operative position immediately above the plate 4, to permit the circuit board 3 and the components 2 to be lifted carefully from the plate 4. The leads 7 extending below the lower surface of the circuit board 3 will therefore all have the same length, which is equal to the thickness of the plate 4. The circuit board 3 is transferred carefully, without inversion, to a soldering machine or station where the portions of the leads 7 extending beneath the circuit board 3 are soldered to effect the circuitry and to retain the components on the circuit board. As the leads are of uniform length, the soldered joints can readily be made of uniform size. Moreover, since the ends of the leads are cut immediately prior to soldering, better joints are formed because there is no time for the cut ends to be oxidized. While the leads are being soldered, another circuit board or boards can be placed on the plate 4 and components assembled on the circuit board or boards as hereinbefore described. The plate 4 can be readily replaced by a plate 4 having a different arrangement of holes therein, if a different circuit board is to have components assembled thereon.

In the embodiment shown in FIGS. 4 to 12 of the drawings, the apparatus comprises a first structure in the form of a frame 21 on which a second structure 22 is slidably mounted. As shown more particularly in FIG. 6, the frame 21 comprises a front end wall 23 and a rear end wall 24 which are spaced apart by side members 25. A pair of substantially parallel rods 26 extend between the end walls 23 and 24 and a carriage 31 is movably mounted on said rods. A substantially rectangular frame 27 for supporting a plate is also mounted on the rods 26 by means of apertured lugs 28 extending from the ends of one side of the frame 27 and the opposite side of the frame 27 is secured to the front wall 23 by means of screws 29 or the like. A series of pegs 30 project from the upper surface of the frame 27 for receiving apertures in a plate as will be hereinafter described.

Mounted beneath the carriage 31 is a nut 32 which is held against rotation by means of a pair of rods 33 secured at one end to a plate (not shown) which projects upwardly from the frame 21 and at the other end to the rear wall 24. A screw-threaded rod 34 is engaged with the screw-thread of the nut 32 and has, at the end remote from the nut, an unthreaded portion which extends through a bore in the end wall 24. A pulley 35 is mounted on this end of the rod 34 and a bearing is preferably provided between the rod and the wall of the bore in the end wall 24. The rod 34 is held against axial movement so that when it is rotated by the pulley 35 it is effective to impart axial movement to the nut 32 along said rod 34. Since the nut 32 is secured to the carriage 31, said carriage is caused to move along the rods 26 between the front and rear end walls 23, 24 of the frame 21, the direction of movement depending on which direction the rod 34 is rotated.

The pulley 35 is arranged to be driven via a belt 36 from a small pulley 37 which is rotatably mounted on a shaft 38 which is secured to the end wall 24. Said shaft 38 is provided with a screw-threaded, reduced-diameter portion which is passed through a bore in the end wall 24 and secured to said end wall by a nut 39 which is engaged with the screw-thread on the shaft 38. A pulley 41 is also rotatably mounted on the shaft 38 and is secured to the pulley 37 for rotation therewith. The pulley 37 is arranged to be driven by an electric motor 42 via a belt 45 and a pulley 44 mounted on the drive shaft 43 of the electric motor 42.

One end of a lever 47 is eccentrically mounted on the pulley 35 by means of a pin 46 and the other end of the lever is pivotally connected by a pin 48 to a bifurcated arm 49. The arm 49 is provided with a bore which is adapted to receive an end 51 of a shaft 52 and the arm is secured to the shaft by a set-screw 50. By means of this arrangement, the angular position of the arm 49 with respect to the shaft 52 can be adjusted. The eccentric arrangement of the lever 47 on the pulley 35 causes the shaft to oscillate in alternate directions when the pulley 35 is rotated in either direction.

Except for the end 51 which is of circular cross-section and which extends through a bore in the end wall 24, the shaft 52 is of substantially square cross-section. This shaft is supported, adjacent its other end, in a bearing 53 housed in a lug 54 projecting downwardly from the carriage 31. Mounted on this end of the shaft 52 is a cage 55 which is also mounted on a shaft 56 rotatably mounted in a bore in a further lug 57 projecting from a plate 58 which is mounted on the rods 26 and secured to the carriage 31 by screws 59 or the like. As shown in FIG. 7, the shaft 56 carries a pinion 61 and the end of said shaft within the cage 55 is provided with a shoulder 60. The cage is secured to the shaft 56 by a pin 62 which is passed through aligned bores in the cage 55 and the shouldered portion 60 of the shaft 56.

The facing surfaces of the carriage 31 and plate 58 are provided with respective channels 63 and 65 in which are located respective bearings 64 and 66. A cutter blade carrier in the form of a block 67 having channels 68 in its side walls in which the bearings 64 and 66 are received is located between the carriage 31 and plate 58 and is mounted on the bearings for reciprocating movement parallel to the facing surfaces of the carriage 31 and plate 58. The bottom surface of the block 67 is provided with a rack 69 which is engaged with the pinion 61. Thus when the shaft 52 is oscillated by rotary movement of the pulley 35, the cage 55, shaft 56 and pinion 61 are likewise oscillated and the block 67 is caused to reciprocate by virtue of the engagement of the rack 69 with the pinion 61.

Mounted on the upper surface of the block 67 are a series of cutters. As shown more particularly in FIG. 9, each cutter comprises a square cutter head 71 having in its centre a counter-sunk bore 72 in which is located a screw 74 with the head of the screw bearing on the shoulder 73 in the bore 72. Concentrically surrounding the shank of the screw 74 are a sleeve 75 and a coil spring 77 and the sleeve is provided with a stepped bore so that a nut 78 engaged with the thread of the screw 74 can engage the shoulder 76 formed by the stepped bore in the sleeve 75. Said sleeve is received in a closed bore 70 in the block 67 and the spring 77 is arranged to bear at one end against the cutter head 71 and at the other end against the block 67. The distance between the cutter head and the block can be adjusted by turning the nut 78 and a lock nut 79 is provided to prevent loss of adjustment once a desired setting of the cutter head has been found. The cutter heads 71 will normally be adjusted so that the tops of said cutter heads are located in a substantially horizontal plane containing the upper surface of the frame 27. The sleeves 75 are secured in their respective bores 70 by means of respective set screws 80.

As shown in FIGS. 4 and 5, the second structure 22 is mounted by means of rollers 81 on rails formed by the side members 25 of the frame 21 so as to be movable horizontally with respect to the frame 21. The rollers 81 are secured to the base regions of a pair of side plates 82 by means of bolts 83 and nuts 84 and the side plates are inter-connected by two spaced-apart, substantially horizontal, plates 85 and 86 secured to the side plates by screws 87.

The plates 85 and 86 are substantially square or rectangular and mounted adjacent each corner of each plate is a bearing 88. The bearings in the corresponding corners of both plates are aligned with one another and mounted in each pair of aligned bearings is a respective rod 89. Each rod 89 is screw-threaded intermediate its ends and mounted on the screw-threaded portion of each rod is a respective screw-threaded boss 91. The four bosses 91 are connected to a further plate 92 which is provided with a multiplicity of bores. Located in each of said bores is a respective rod or pin 93. The rods or pins 93 are a loose fit in their respective bores and each rod or pin 93 has an enlarged head portion 94 as shown in FIG. 10 to prevent it from slipping right through its bore and falling out of the plate 92. The plate 85 is also provided with a multiplicity of bores which are aligned with the bores in the plate 92 so that the rods or pins 93 also extend through the aligned bores in the plate 85.

Mounted on the upper end of each rod 89 above the plate 86 is a respective pulley or sprocket 95 and these pulleys or sprockets are arranged to be driven by a pulley or sprocket 97 via a belt or chain 96. Sprockets and a chain are preferred in order to eliminate any possibility of slip in the transmission and to ensure that all of the rods 89 are rotated in unison. The pulley or sprocket 97 is mounted on a shaft 98 which carries a pulley 99 which is arranged to be driven by an electric motor 101 via a pulley 103 mounted on the drive shaft 102 of the motor 101 and a drive belt 104.

Further details of the apparatus will be referred to in the description of the operation of the apparatus which follows. A circuit board 105 having mounted thereon a series of electrical components, such as resistors, capacitors, transistors and diodes, is placed on a plate 106. The electrical components have connecting leads extending through holes in the circuit board 105, and the plate 106 is provided with a series of holes 107 (FIG. 11) which are aligned with the holes in the circuit board 105 so that the projecting leads will also pass through the holes 107 in the plate 106. If desired, an empty circuit board 105 may be placed on the plate 106 and the electrical components fitted to the board while said board is located on the plate.

The plate 106 is further provided with four through-going bores 108 which are arranged to receive the pegs 30 when the plate is placed on the frame 27. However, before this can be done, the structure 22 must be moved to the right as shown in FIG. 4 so that it is clear of the frame 27 to enable the plate to be laid on the frame. The cooperating pegs 30 and bores 108 ensure that the plate 106 and circuit board 105 are correctly located on the frame 27.

The structure 22 is now returned to the position shown in FIG. 4 and the motor 101 is started to drive the pulley 99 and hence the pulleys or sprockets 95 via the belt or chain 96. The rods 89 are thus rotated and, since they are held by the bearings 88 against axial movement, their rotational movement is effective to move the plate 92 axially with respect to the rods 89 towards the lower fixed plate 85. Mounted in a further series of bores in the plate 85 are four tubes 111 (FIG. 12) which are not visible in FIGS. 4 and 5. Each tube is provided at its upper end with a head 112 and intermediate its ends with a collar 114 and a transverse pin 113. A respective coil spring 115 surrounds each tube 111 and bears at one end against the underneath surface of the plate 92 and at the other end against the associated collar 114 thus holding the collar against the associated transverse pin 113. When the plate 92 is in the raised position shown in FIG. 5 in which the rods or pins 93 are clear of the components on the circuit board 105, the springs 115 are effective to urge the heads 112 of the tubes 111 against the upper surface of the plate 92. This position is not shown in the drawings. The tubes 111 also extend through aligned bores in the lower fixed plate 85 as shown in FIG. 12. It should be noted that, in this figure, the rods 89 and the rods or pins 93 are omitted in the interests of clarity.

When the structure 22 is in the position shown in FIG. 4 of the drawings, the tubes 111 are aligned with the upstanding pegs 30 so that, as the plate 92 is lowered towards the fixed plate 85, the lower ends of the tubes 111 fit over the upstanding pegs 30. The plate 106 is thus positively secured in position on the frame 27 and cannot be dislodged until the plate 92 is raised again. The springs 115 now serve to urge the lower ends of the tubes 111 against the plate 106 as shown in FIG. 12 and the spring pressure is increased with further downwards movement of the plate 92. Additional rods, similar to the tubes 111 may be provided, each rod having a head similar to the heads 112 and a coil spring, to assist in clamping the plate 106 in position.

Continual downward movement of the plate 92 brings the bottoms of the rods or pins 93 into contact with the electrical components on the circuit board 105. Since the rods are axially movable with respect to the plate 92 they merely rest on the electrical components with their own weight and thus excessive force on the components which could damage them is avoided. The plate is lowered until all of the rods or pins 93 are in contact with an electrical component or with the circuit board 105 itself. This position is shown in FIG. 4 of the drawings.

While the plate 92 is being lowered, the carriage 31 is in one of its two end positions of travel, i.e. either the front of the carriage is adjacent the front end wall 23 or the rear of the carriage is adjacent the rear end wall 24. Once the plate 92 has been fully lowered, the motor 101 is stopped and the motor 42 is started. This is effective to drive the pulley 35 which causes the screw-threaded rod 34 to be rotated. The motor 101 is a reversible motor and its direction of rotation is dependent on the position of the carriage 31 when the motor 101 is to be started. The motor is arranged to drive the pulley 35 in the direction which rotates the screw-threaded rod 34 in the direction which causes the nut to move axially along said rod so that the carriage is moved away from the end wall to which it is adjacent and towards the other end wall. At the same time, the lever 47 eccentrically mounted on the pulley 35 causes the shaft 52 to oscillate which in turn imparts an oscillating movement to the pinion 61 via the cage 55 and shaft 56. By virtue of the engagement of the pinion 61 by the rack 69, the block 67 and hence the cutter heads 71 are also caused to oscillate.

Since the cutter heads 71 are located in the same plane as the frame 27, the tops of said cutter heads are in contact with the underneath surface of the plate 106, the springs 77 ensuring that this contact is maintained. As the carriage is moved along the rods 26, the cutter heads 71 effect shearing of the leads projecting through the plate 106. FIG. 4 shows the position in which the carriage 31 is being moved from the front wall 23 towards the rear wall 24 and in which the projecting leads towards the front of the circuit board 105 have already been cropped by the cutter heads 71 while the leads not yet traversed by the cutter heads 71 still project from the plate 106. The oscillating action of the block 67 carrying the cutter heads 71 ensures that the whole of the underneath surface of the plate 106 is traversed by the cutter heads to ensure that all of the projecting leads are sheared off during travel of the carriage from one end position to the other.

When the carriage 31 has completed its travel, the motor 42 is stopped and the motor 101 is re-started but is arranged to drive the pulley 99 in the opposite direction. The rods 89 are thus rotated in the opposite direction and cause the plate 92 to move upwardly away from the lower fixed plate 85. The engagement of the heads 94 by the plate 92 causes the rods or pins 93 to be lifted clear of the components on the circuit board. Further upward movement of the plate 92 causes said plate to engage the heads 112 of the tubes 111 (FIG. 12) and to lift said tubes from the pegs 30. Only when the tubes 111 are clear of the pegs 30 can the structure 22 be moved to the right with respect to the position shown in FIG. 4 to enable the plate 106 and circuit board 105 to be lifted from the frame 27. The tubes 111 are not raised clear of the pegs 30 until all of the rods or pins 93 have been lifted clear of the components on the circuit board 105 and this arrangement ensures that the said components are not dislodged from the board when the structure 22 is moved away from the board. Once the tubes 111 have been lifted clear of the pegs 30, the electric motor 101 can, of course, be stopped.

Once the motor 101 is stopped and the structure 22 moved to the right with respect to the position shown in FIG. 4 of the drawings, the plate 106 with the board 105 thereon can be lifted off the frame 27 and removed from the apparatus for a subsequent operation such as soldering. A further plate with another circuit board located thereon can then be placed on the frame 27 and the operation repeated. In this case however, the motor 42 will be operated in the opposite direction so that the screw-threaded rod 34 is rotated in the opposite direction to move the carriage 31 from adjacent the rear end wall 24 towards the front end wall 23 in order to shear off the portions of the connecting leads projecting through the board supporting plate. Thus the leads will be cropped by the cutter heads in either direction of movement of the carriage.

As shown in FIGS. 8 and 9, the cutter heads 71 are free to rotate and during operation while the block 67 is subjected to oscillating movements, the cutter heads rotate as they contact leads projecting from the underneath surface of the plate 106. A blade is provided along each of the four sides of each cutter head to ensure that the leads are cut no matter which side of a cutter head 71 contacts them.

FIG. 13 shows a modified form of cutter in which the cutter heads 71 are replaced by a series of short blades 115, each blade replacing two of the cutter heads 71. The cutter is otherwise the same as that shown in FIGS. 8 and 9 of the drawings so that each blade 115 is provided with two stepped bores 72 each of which receives a screw 74. Each blade 115 is therefore urged in a direction away from the block by a pair of coil springs 77 each surrounding a respective sleeve 75. Furthermore, each blade 115 is desirably provided with serrated cutting edges 116 on two opposite sides so that the projecting leads are cut by a sawing action when the block 67 (and hence the blades) is being oscillated.

Serrated cutting edges may also be employed on the single blade 5 shown in FIGS. 1 and 2 of the drawings or on the cutter heads 71 shown in FIGS. 4 to 9 of the drawings.

The cutter blades 115 shown in FIG. 13 may, if desired, be replaced by a series of cutter heads as shown in FIG. 14 each of which comprises a rectangular blade carrier 117 having a slot 118 in which a blade 119 is mounted. The blade carrier is provided with two stepped bores 72 for mounting it on the block 67 in like manner to the blades 115 and the slot extends at right angles to the oscillating movement of the block but parallel to the direction of movement of the carriage 31.

Figure 3:
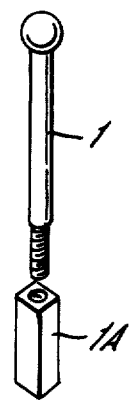
FIG. 3 is a perspective view of a clamping rod shown in FIGS. 1 and 2.
Figure 6:
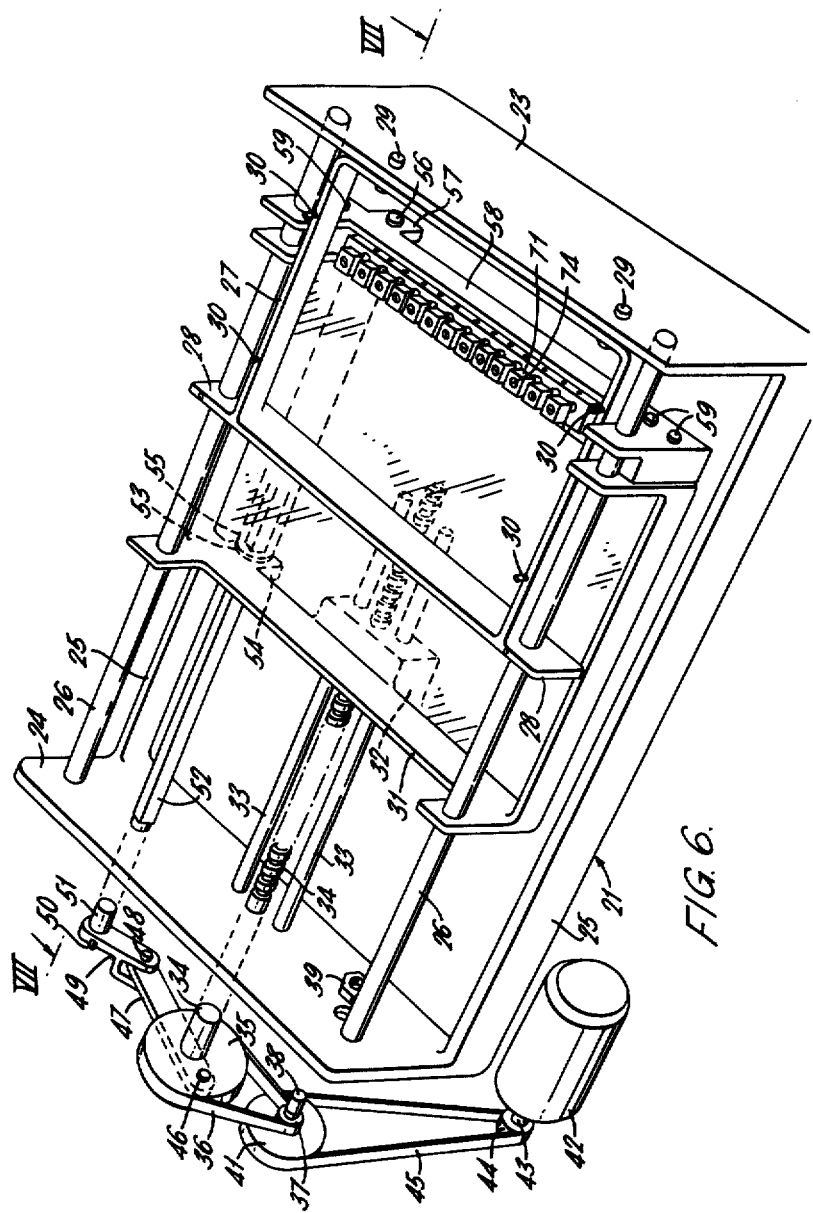
FIG. 6 is a perspective view of the first structure of the apparatus shown in FIGS. 4 and 5.

If desired, the rods and pins shown in FIGS. 1 to 3 of the drawings may be replaced by a multiplicity of the rods or pins 93 shown in FIG. 10 of the drawings. Alternatively, the rods or pins 93 in the apparatus shown in FIGS. 4 and 5 of the drawings may be replaced by a multiplicity of the rods 1A and pins 1 shown in FIG. 3 of the drawings.

Moreover, the structure 22 may if desired be provided with vibrating means (not shown) for ensuring that the rods and/or pins fall to their lowermost position during operation of the apparatus. However, it is also possible to achieve this by raising the plate 92 to such an extent during its upward stroke that the upper ends of the rods or pins are engaged by the underneath surface of the upper fixed plate 86.

Other modifications and embodiments are possible without departing from the scope of this invention as defined by the appended claims.

I claim:

1. Apparatus for cropping the connecting leads of electrical components assembled on a circuit board having locating holes therein through which the leads have been inserted, said apparatus comprising a plate provided with holes at spacings corresponding to the holes in the circuit board which are to be used to locate the components, said plate having a first surface against which, in use, is placed the circuit board on which electrical components have been arranged by passing the leads thereof through appropriate holes in the circuit board, the leads extending through the holes in the circuit board and also through corresponding holes in the plate; a first structure adapted to support the plate and on which is mounted a cutter means movable in proximity to a second surface of the plate substantially parallel with said first surface to crop the portions of the leads of the components extending through the holes in the plate beyond said second surface by a shearing or cutting action; and a second structure carrying a multiplicity of substantially parallel rods which are movable into engagement with components on a circuit board placed on said plate which is supported on the first structure, the ends of the rods engaging said components to hold the components in position on the circuit board and said rods being individually axially displaceable whereby the rods are displaced relatively to one another according to the size or shape of the different components, said first and second structures being movable relative to one another whereby movement of one of said structures toward or away from the other is effective to move the rods into engagement with the components on the circuit board or to release the rods from the components.

2. Apparatus as claimed in claim 1, in which the first structure is adapted to support the plate in a substantially horizontal plane with the said first surface of the plate uppermost and in which the second structure is capable of being positioned with the rods located above a circuit board placed on the plate, said rods being upwardly displaceable by engagement of components on the circuit board with the lower ends of the rods against the downwardly acting weight of the rods to clamp the components on the circuit board when relative movement of the first and second structures towards one another is effected.

3. Apparatus as claimed in claim 2, in which the rods are positioned adjacent each other in a grid pattern extending over at least a major portion of the plate.

4. Apparatus as claimed in claim 2, in which each rod is provided with an enlarged head portion to prevent it from falling out of the second structure.

5. Apparatus as claimed in claim 2, in which the second structure includes a plate having a plurality of bores therein and in which the rods are axially displaceably mounted in the bores in said plate.

6. Apparatus as claimed in claim 5, in which the plate supporting the rods is movable with respect to the remainder of the second structure.

7. Apparatus as claimed in claim 6, in which the plate supporting the rods is arranged to be driven by an electric motor and is movable towards and away from the first structure.

8. Apparatus as claimed in claim 5, in which the second structure is movably mounted on the first structure.

9. Apparatus as claimed in claim 8, in which the second structure is provided with rollers engaged with rails forming part of the first structure and is movable in a horizontal direction with respect to said first structure.

10. Apparatus as claimed in claim 9, in which means are provided to prevent horizontal movement of the second structure with respect to the first structure when the rods are in a position to clamp components on a circuit board supported on the board supporting plate.

11. Apparatus as claimed in claim 10, in which said means comprise a number of upstanding pegs provided on the first structure which are engageable by a corresponding number of tubular members carried by the second structure when the rods are moved towards a circuit board supported on the board supporting plate to clamp components on said circuit board.

12. Apparatus as claimed in claim 5, in which the second structure is provided with a further plate having a plurality of bores aligned with the bores in the plate supporting the rods and in which the rods extend through the aligned bores in said further plate.

13. Apparatus as claimed in claim 1, in which the cutter means is mounted on a carriage which is movably mounted in the first structure.

14. Apparatus as claimed in claim 13, in which the carriage is arranged to be driven by an electric motor.

15. Apparatus as claimed in claim 14, in which the cutter means is mounted for oscillating movement with respect to the carriage.

16. Apparatus as claimed in claim 15, in which the cutter means is mounted on a carrier having a rack engaged by a pinion for imparting oscillating movement to said cutter means.

17. Apparatus as claimed in claim 16, in which the pinion is arranged to be driven by the motor arranged to drive the carriage via a linkage which is arranged to convert rotary drive from the motor into an oscillating drive to the pinion.

18. Apparatus as claimed in claim 17, in which the linkage comprises a lever eccentrically mounted at one end on a pulley arranged to be driven by the motor and connected at the other end to an arm mounted on a shaft operatively connected to the pinion.

19. Apparatus as claimed in claim 16, in which the cutter means comprises a plurality of blades mounted on the carrier.

20. Apparatus as claimed in claim 19, in which the blades are resiliently mounted on the carrier and are arranged to be individually resiliently urged into engagement with the said second surface of the board supporting plate.

21. Apparatus as claimed in claim 20, in which the blades are each mounted so as to be rotatable about a substantially vertical axis.

22. Apparatus as claimed in claim 21, in which each blade has a plurality of cropping edges spaced from the axis of rotation.

23. Apparatus as claimed in claim 22, in which each blade takes the form of a square disc.

24. Apparatus as claimed in claim 20, in which each blade is mounted on the carrier by means of a pair of pins, a spring being provided on each pin to urge the blade in a direction away from the carrier.

25. Apparatus as claimed in claim 24, in which each blade is provided with two cutting edges, said cutting edges extending on opposite sides of the blade in a direction substantially parallel to the oscillating movement and substantially perpendicular to the direction of movement of the carriage.

26. Apparatus as claimed in claim 25, in which each cutting edge of each blade is serrated.

27. Apparatus as claimed in claim 20, in which each blade is mounted in a slot on an auxiliary blade carrier and in which each auxiliary blade carrier is mounted on the main carrier by means of a pair of pins, a spring being provided on each pin to urge the blade carried by said auxiliary blade carrier in a direction away from the said main carrier.

28. Apparatus as claimed in claim 1, in which the cutter means comprises a single blade.

* * * * *